(12) United States Patent
Hou

(10) Patent No.: US 7,965,112 B2
(45) Date of Patent: Jun. 21, 2011

(54) POWER-ON RESET CIRCUITS

(75) Inventor: Chun-Chih Hou, Tainan County (TW)

(73) Assignee: Mediatek Inc., Hsin-Chu (TW)

( * ) Notice: Subject to any disclaimer, the term of this patent is extended or adjusted under 35 U.S.C. 154(b) by 266 days.

(21) Appl. No.: 11/860,554

(22) Filed: Sep. 25, 2007

(65) Prior Publication Data

US 2008/0079467 A1    Apr. 3, 2008

Related U.S. Application Data

(60) Provisional application No. 60/827,436, filed on Sep. 29, 2006.

(51) Int. Cl.
*H03L 7/00* (2006.01)
(52) U.S. Cl. ......................... 327/142; 327/143
(58) Field of Classification Search .................. 327/142, 327/143, 530, 534, 538–541
See application file for complete search history.

(56) References Cited

U.S. PATENT DOCUMENTS

| 4,803,702 A | 2/1989 | Chen et al. |
| 6,437,614 B1 | 8/2002 | Chen |
| 2006/0208777 A1* | 9/2006 | Ichikawa et al. ............... 327/142 |

FOREIGN PATENT DOCUMENTS

| JP | 7129279 | 5/1995 |
| JP | 11112315 | 4/1999 |

OTHER PUBLICATIONS

CN Office Action mailed Jun. 5, 2009.
English abstract of JP7129279.
English abstract of JP11112315.

* cited by examiner

*Primary Examiner* — Lincoln Donovan
*Assistant Examiner* — Diana J Cheng
(74) *Attorney, Agent, or Firm* — Thomas|Kayden

(57) ABSTRACT

Power-on reset circuits are disclosed. A first reset circuit includes a first comparator to output a system reset signal, and a second reset circuit outputs a first reset signal to control operations of the first comparator, such that the first reset circuit outputs the system reset signal when a first voltage is less than a first reference voltage.

21 Claims, 7 Drawing Sheets

POWER-ON RESET CIRCUITS

CROSS REFERENCE TO RELATED APPLICATIONS

This application claims the benefit of U.S. Provisional Application No. 60/827,436, filed Sep. 29, 2006, and entitled "A Low Voltage Power Reset Circuit".

BACKGROUND OF THE INVENTION

1. Field of the Invention

The invention relates to power-on reset circuits, and more particularly to a power-on reset circuit with two reset circuits connected in series.

2. Description of the Related Art

A power-on reset (POR) circuit is typically required in a semiconductor device for preventing malfunctions from occurring when a power supply voltage is applied to the semiconductor device. When the semiconductor device is operated before the power supply voltage reaches a suitable operational level, abnormal operations may occur. Accordingly, a reset signal (RESET) resets the semiconductor device if a power supply voltage has been applied but not reached a predetermined voltage level. The reset signal is released after the power supply has reached the predetermined voltage level range.

BRIEF SUMMARY OF THE INVENTION

A detailed description is given in the following embodiments with reference to the accompanying drawings.

A power-on reset circuit is provided. An exemplary embodiment of a power-on reset circuit of the invention comprises a first reset circuit comprising a first comparator for outputting a system reset signal, and a second reset circuit outputting a first reset signal to control operations of the first comparator, such that the first reset circuit outputs the system reset signal when a first voltage is less than a first reference voltage.

Another embodiment of a power-on reset circuit comprises a first reset circuit outputting a first reset signal when a voltage-division of a power supply voltage is less than a reference voltage. A second reset circuit is coupled to the first reset circuit in series and comprises a first comparator controlled by the first reset signal for outputting a system reset signal to reset an external circuit.

Another embodiment of a power-on reset circuit comprises a first reset circuit comprising a first comparator with a first input terminal coupled to a first reference voltage, a second input terminal coupled to a first node and an output terminal generating a first reset signal. A second reset circuit comprises a second comparator with a first input terminal coupled to a second reference voltage and a second input terminal coupled to a second node and an output terminal generating a system reset signal, wherein the output terminal of the first comparator is coupled to the second comparator.

Another embodiment of a power-on reset circuit comprises a first reset circuit comprising a first voltage supply unit providing a first reference voltage, and a first comparator with a first input terminal coupled to the first reference voltage, a second input terminal coupled to a first node in a first resistor string coupled between a power supply voltage and a ground voltage and an output terminal generating a first reset signal. A second reset circuit comprises a second voltage supply unit providing a second reference voltage, and a second comparator with a first input terminal coupled to the second reference voltage and a second input terminal coupled to a second node in a second resistor string and an output terminal generating a system reset signal. The output terminal of the first comparator is coupled to the second resistor string, a power terminal of the second comparator or the second input terminal.

The invention further provides a power-on reset method, an exemplary embodiment of which comprises a first reset signal output to a second reset circuit by a first reset circuit when a first voltage is less than a first reference voltage, and a comparator in the second reset circuit outputs a system reset signal according to the first reset signal.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
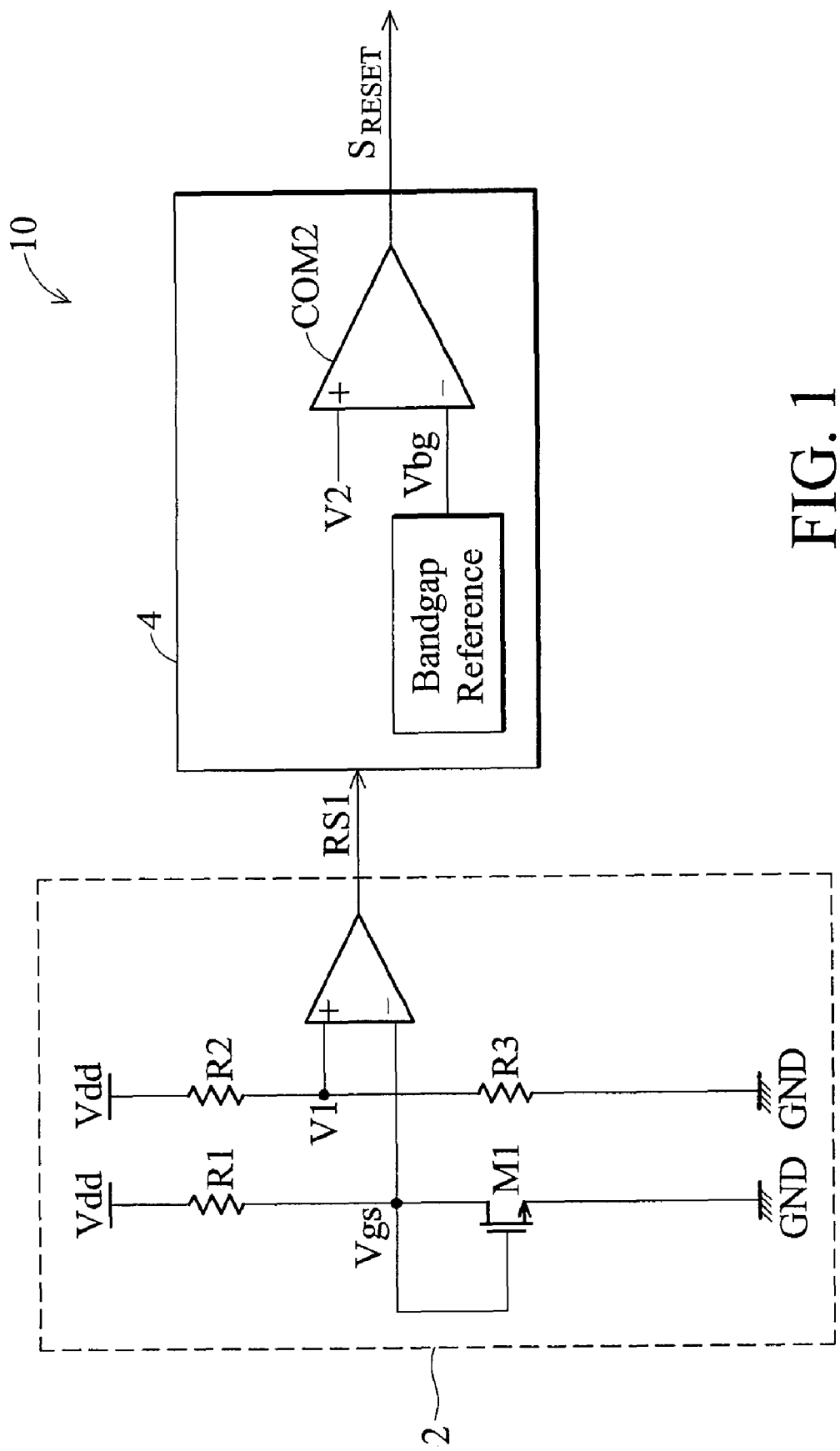
FIG. 1 is a diagram of an embodiment of a power-on reset circuit according to the invention.

FIG. 1 is a diagram of a power-on reset circuit according to the invention. As shown, a power-on reset circuit 10 comprises two reset circuits 2 and 4 connected in series, the reset circuit 2 outputs a reset signal RS1 when a voltage V1 obtained by a voltage-divided power supply voltage Vdd is less than a reference voltage Vgs, and the reset circuit 4 outputs a system reset signal $S_{RESET}$ to reset an external circuit (not shown) when the voltage V2 is less than a reference voltage Vbg. For example, the reference voltage Vgs is a threshold voltage of a MOS transistor M1 and is less than the reference voltage Vbg.

It should be noted that the reset signal RS1 from the reset circuit 2 controls operations of a comparator COM2 in the reset circuit 4 when the voltage V1 is less than the reference voltage Vgs. The reset circuit 2 stops outputting the reset signal RS1 when the voltage V1 exceeds the reference Vgs, the reset circuit 4 then outputs the system reset signal $S_{RESET}$ according to a voltage V2 obtained by voltage-dividing of the power supply voltage Vdd and the reference voltage Vbg. For example, the comparator COM2 continues to output the system reset signal $S_{RESET}$ if the voltage V2 is less than the reference voltage Vbg, and stops outputting the system signal $S_{RESET}$ when the voltage V2 meets the reference voltage Vbg. Thus, the power-on reset circuit 10 can output the system reset signal to reset the external circuit when the divided voltage of the power supply voltage Vdd is less than the reference voltage Vbg, thereby preventing the external circuit from operating with a lower power supply voltage.

Figure 2:
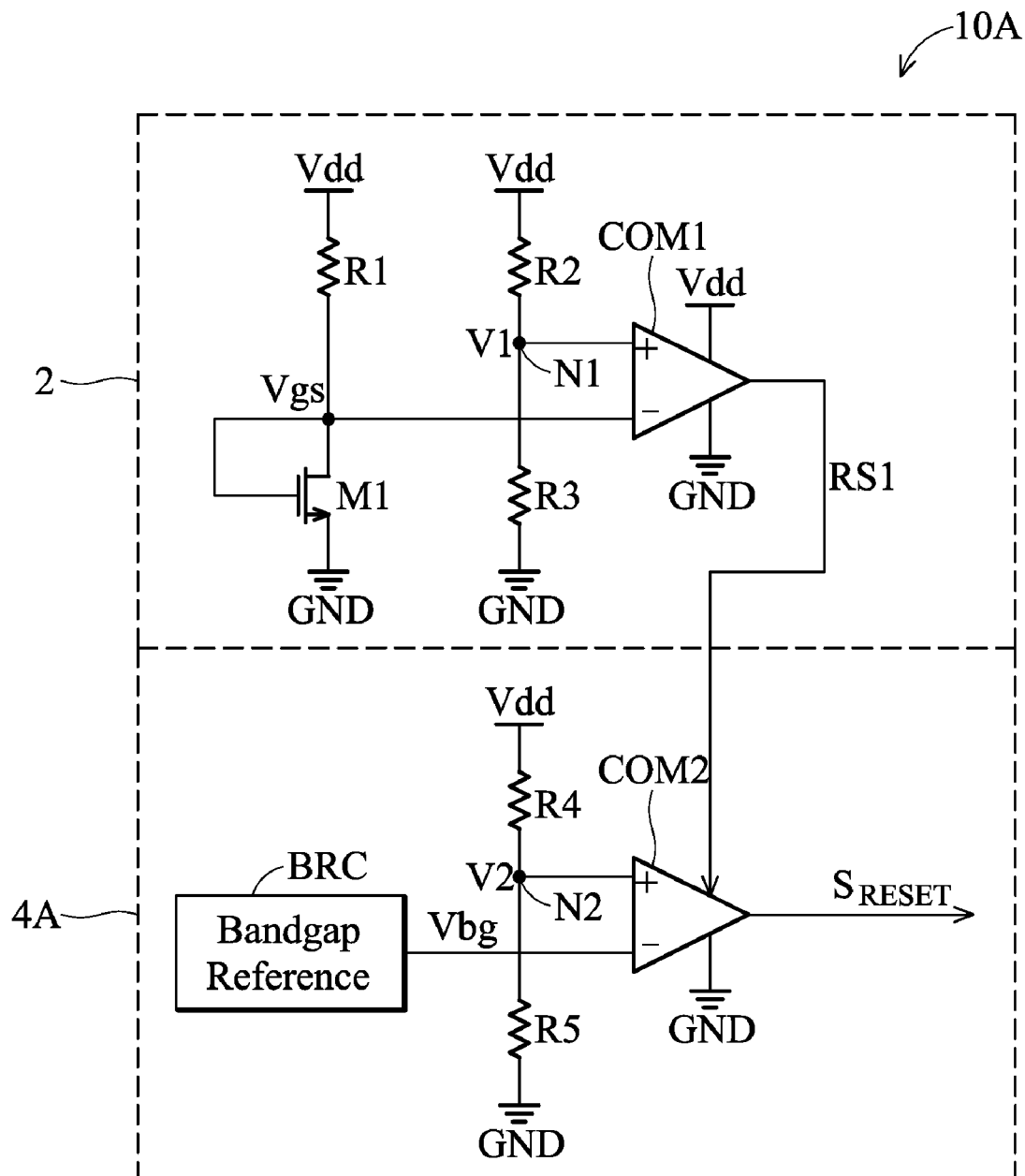
FIG. 2 shows an embodiment of a power-on reset circuit.

FIG. 2 shows an embodiment of a power-on reset circuit. As shown, a power-on reset circuit 10A comprises two reset circuits 2 and 4A connected in series. The reset circuit 2 comprises resistors R1~R3, a MOS transistor M1 and a comparator COM1. The resistor R1 is coupled between the power supply voltage Vdd and the MOS transistor M1, and the MOS transistor M1 is coupled between the resistor R1 and a ground voltage GND, in which the resistor R1 and the MOS transistor M1 form a voltage supply unit providing the threshold voltage of the MOS transistor M1 to serve as a reference voltage Vgs.

The resistors R2 and R3 are connected in series, the resistor R2 is coupled between the power supply voltage Vdd and a node N1. The resistor R3 is coupled between the node N1 and the ground voltage GND, in which the resistors R2 and R3 form a voltage-division circuit (a resistor string) performing voltage division to the power supply voltage Vdd to obtain a voltage V1 on the node N1. The comparator COM1 comprises two input terminals coupled to the reference voltage Vgs and the voltage V1 on the node N1 respectively, two power terminals coupled to the power supply voltage Vdd and the ground voltage GND respectively, and an output terminal coupled to a comparator COM2 in the reset circuit 4A. For example, the MOS transistor M1 can also be replaced by other transistors, such as bipolar junction transistors (BJTs), JFETs and similar.

The reset circuit 4A comprises resistors R4 and R5, a bandgap reference circuit BRC and a comparator COM2. The bandgap reference circuit BRC provides a reference voltage Vbg exceeding the reference voltage Vgs to the comparator COM2. The resistors R4 and R5 are connected in series. The resistor R4 is coupled between the power supply voltage Vdd and a node N2, and the resistor R5 is coupled between the node N2 and the ground voltage GND. Resistors R4 and R5 form a voltage-division circuit (another resistor string) performing voltage division to the power supply voltage Vdd to obtain a voltage V2 on the node N2.

The comparator COM2 comprises two input terminals coupled to the reference voltage Vbg and the voltage V2 on the node N2 respectively, a first power terminal coupled to the output terminal of the comparator COM1, a second power terminal coupled to the ground voltage GND, and an output terminal outputting the system reset signal $S_{RESET}$.

Figure 3:
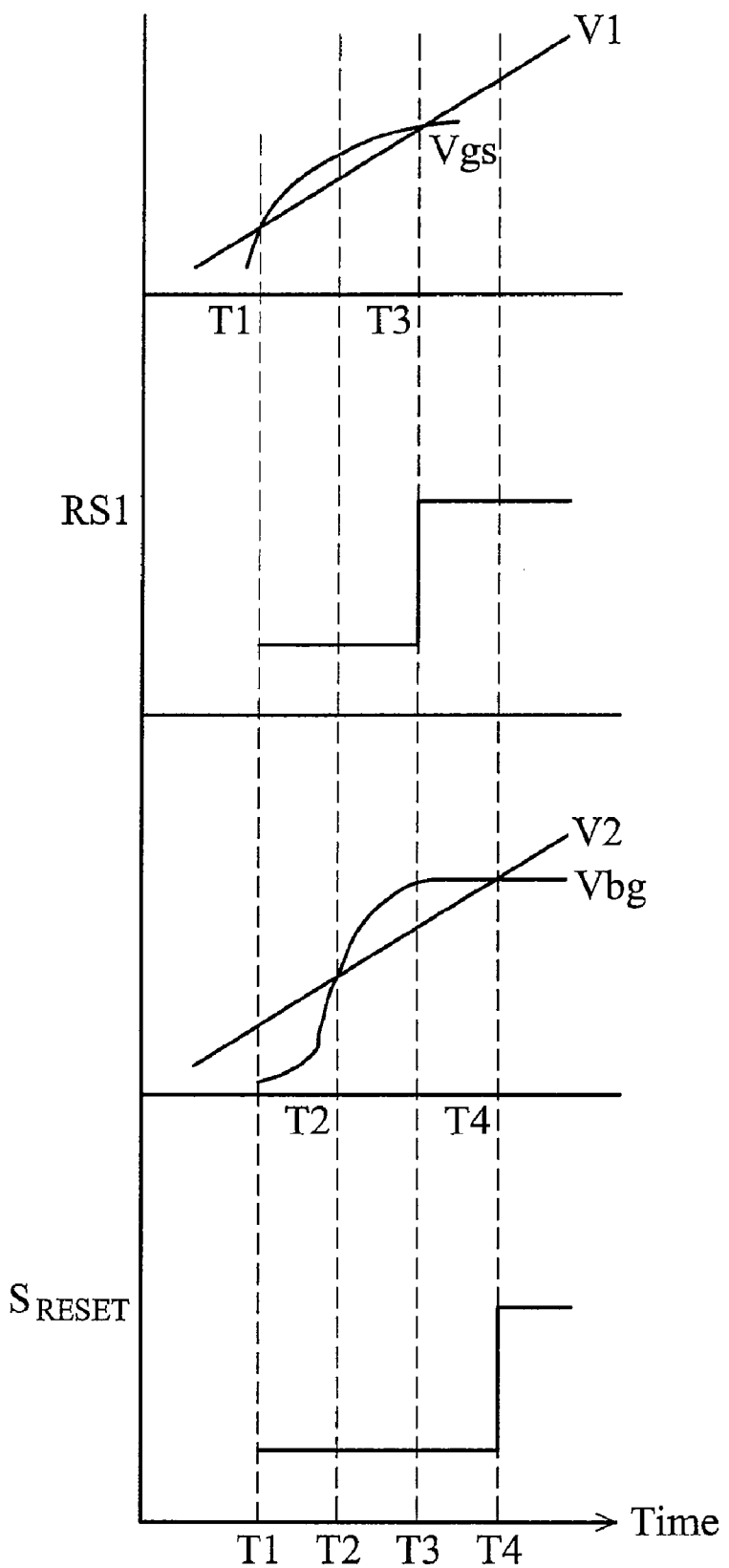
FIG. 3 shows an output wave diagram of a power-on reset circuit.

The operation of the power-on reset circuit 10A is described in the following with reference to FIG. 3. At time T1, because the voltage V1 is less than the reference voltage Vgs, the comparator COM1 pulls the output terminal thereof to the ground voltage GND, i.e., the comparator COM1 outputs the reset signal RS1 to the comparator COM2. When the reset signal RS1 is applied to the first power terminal of the comparator COM2, the comparator COM2 pulls the output terminal thereof to the ground voltage GND even if the voltage V2 exceeds the reference voltage Vbg provided by the bandgap reference circuit BRC at this time. Namely, the system reset signal $S_{EREST}$ (with low logic level) is output to the external circuit (not shown).

At time T2, because the voltage V1 is still less than the reference voltage Vgs, the comparator COM1 continues to output the reset signal RS1, i.e., the first power terminal of the comparator COM2 is pulled to the ground voltage GND, such that comparator COM2 outputs the system reset signal regardless of the voltage V2.

At time T3, because the voltage V1 exceeds the reference voltage Vgs, the comparator COM1 pulls the output terminal thereof to the power supply voltage Vdd, i.e., the comparator COM1 stops outputting the reset signal RS1 at this time. Because the first power terminal of the comparator COM2 is pulled to the power supply voltage Vdd, the comparator COM2 outputs the system reset signal $S_{RESET}$ according to the voltage V2 and the reference voltage Vbg. The comparator COM2 continues to pull the output terminal thereof to the ground voltage GND as the system reset signal $S_{RESET}$ because the voltage V2 is less than the reference voltage Vbg after time T2.

At time T4, the comparator COM2 pulls high the output terminal thereof to the power supply voltage Vdd, i.e., the comparator COM2 stops outputting the system reset signal $S_{RESET}$ at this time, because the voltage V2 exceeds the reference voltage Vbg.

Briefly, the reset circuit 2 outputs the reset signal RS1 to let the comparator COM2 in the reset circuit 4A to output the system reset signal $S_{RESET}$ when the voltage V1 is less than the reference voltage Vgs. When the voltage V1 exceeds the reference voltage Vgs, and the reset circuit 4A outputs the system reset signal $S_{RESET}$ according to the voltage V2 and the reference voltage Vbg. If the voltage V2 is less than the reference voltage Vbg at this time, the comparator COM2 continues to output the system reset signal $S_{RESET}$ and stops outputting the system signal $S_{RESET}$ if not.

Namely, by choosing appropriate resistors R1~R5, the voltage V1 is less than the reference voltage Vgs (at time T1) before the reference voltage Vbg exceeds the voltage V2 (at time T2), such that the power-on reset circuit 10A can output the system reset signal $S_{RESET}$ to reset the external circuit correctly during time T1~T4.

Figure 4:
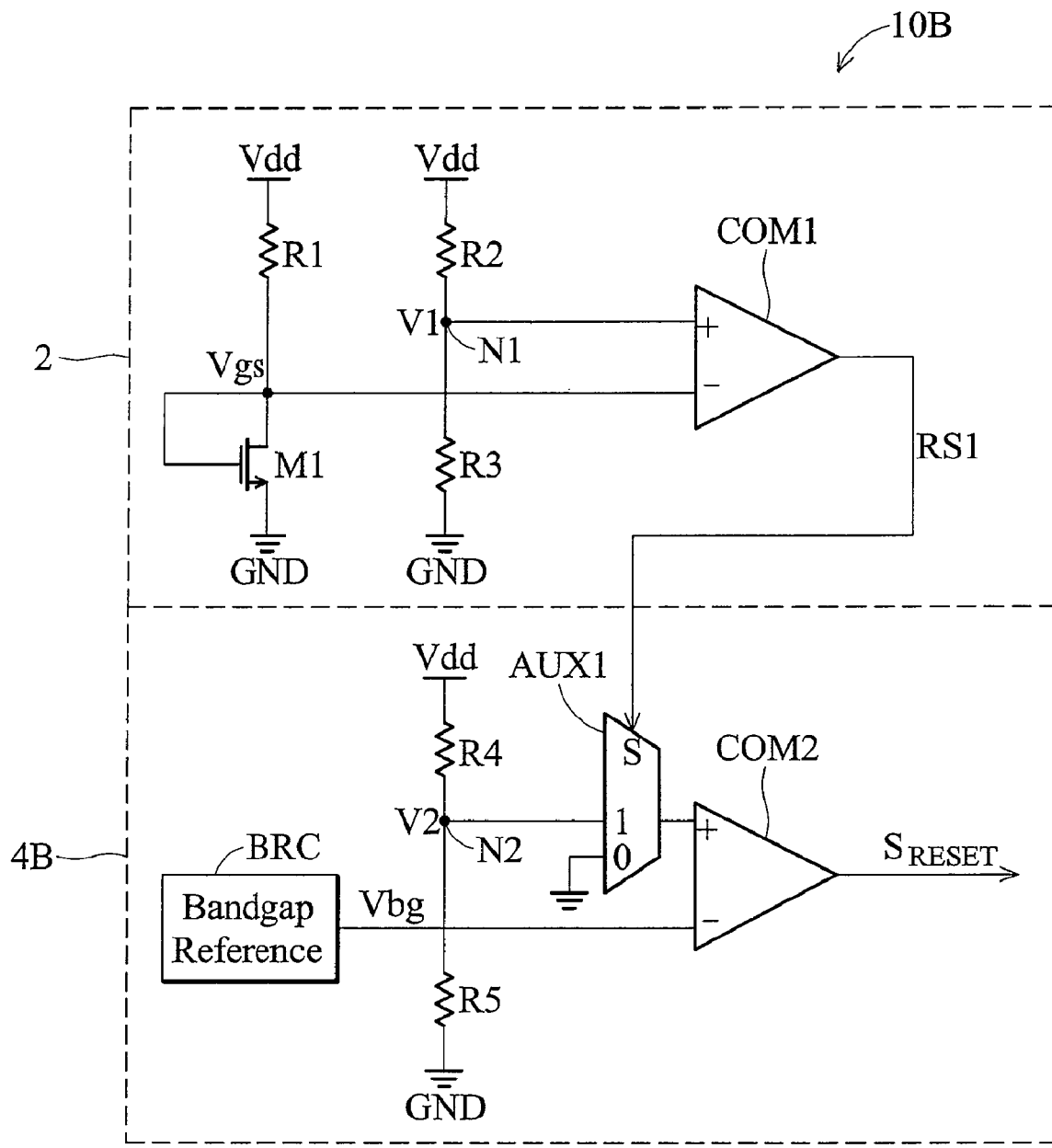
FIG. 4 shows another embodiment of a power-on reset circuit.

FIG. 4 shows another embodiment of the power-on reset circuit. As shown, the power-on reset circuit 10B is similar to that shown in FIG. 2 except that the reset circuit 4B further comprises a multiplexer AUX1 and the output terminal of the comparator COM1 in the reset circuit 2 is coupled to the multiplexer AUX1 rather than the first power terminal of the comparator COM2 in the reset circuit 4B. The multiplexer AUX1 comprises a first input terminal coupled to the node N2, a second input terminal coupled to the ground voltage GND, an output terminal coupled to an input terminal of the comparator COM2, and a control terminal coupled the reset signal RS1 from the output terminal of the comparator COM1. Structures and connection of the reset circuit 2 and the other elements in the reset circuit 4B are similar to those in FIG. 2, and thus, description thereof is omitted for brevity.

Operation of power-on reset circuit 10B is described in detail in the following with reference to FIG. 3. At time T1, because the voltage V1 is less than the reference voltage Vgs, the comparator COM1 pulls the output terminal thereof to the ground voltage GND, i.e., the reset signal RS1 is output to the reset circuit 4B. When the reset signal RS1 is applied to the control terminal of the multiplexer AUX1, the multiplexer AUX1 pulls one terminal of the comparator COM2 to the ground voltage GND. Hence, the comparator COM2 pulls the output terminal thereof to the ground voltage GND regardless of whether the voltage V2 exceeds the reference voltage Vbg provided by the bandgap reference circuit BRC. Namely, the system reset signal $S_{RESET}$ (with low logic level) is output to the external circuit (not shown).

At time T2, because the voltage V1 is still less the reference voltage Vgs, the comparator COM1 continues to output the reset signal RS1, i.e., the first power terminal of the comparator COM2 is pulled to the ground voltage GND, such that comparator COM2 outputs the system reset signal $S_{RESET}$.

At time T3, because the voltage V1 exceeds the reference voltage Vgs, the comparator COM1 pulls the output terminal thereof to the power supply voltage Vdd, i.e., the comparator COM1 stops outputting the reset signal RS1 at this time. Hence, the multiplexer AUX1 couples the voltage V2 on the node N2 to the positive input terminal of the comparator COM 2. The comparator COM2 continues to pull the output terminal thereof to the ground voltage as the system reset signal $S_{RESET}$ because the voltage V2 is less than the reference voltage.

At time T4, the comparator COM2 pulls high the output terminal thereof to the power supply voltage Vdd, i.e., the comparator COM2 stops outputting the system reset signal $S_{RESET}$ at this time, because the voltage V2 exceeds the reference voltage Vbg.

Figure 5:
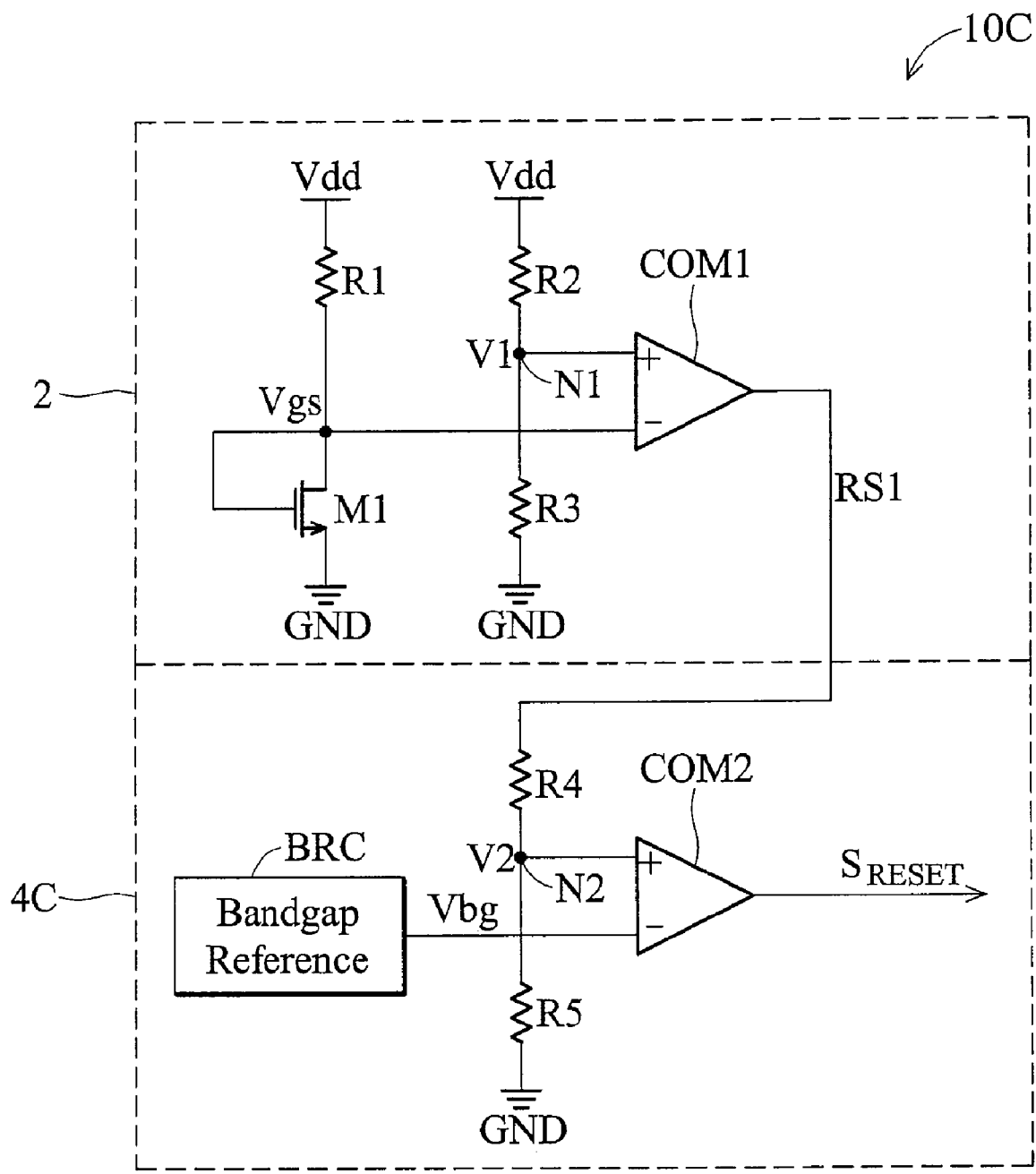
FIG. 5 shows another embodiment of a power-on reset circuit.

FIG. 5 shows another embodiment of the power-on reset circuit. As shown, the power-on reset circuit 10C is similar to that shown in FIG. 2 except that the output terminal of the comparator COM1 in the reset circuit 2 is coupled to one terminal of the resistor R4 rather than the first power terminal of the comparator COM2 in the reset circuit 4C. Structures and connection of the reset circuit 2 and the other elements in the reset circuit 4C are similar to those in FIG. 2, and thus, further description thereof is omitted for brevity.

Operation of power-on reset circuit 10C is described in detail in the following with reference to FIG. 6. At time T1, because the voltage V1 is less than the reference voltage Vgs, the comparator COM1 pulls the output terminal thereof to the ground voltage GND, i.e., the reset signal RS1 is output to the reset circuit 4C. As the reset signal. RS1 is applied to the resistor R4, the resistors R4 and R5 are both coupled to the ground voltage GND, such that the voltage V2 on the node N2 is pulled to the ground voltage GND accordingly. Hence, the voltage V2 is less than the reference voltage Vbg and thus, the comparator COM2 pulls the output terminal thereof to the ground voltage GND as the system reset signal $S_{RESET}$ output to the external circuit (not shown).

At time T2, because the voltage V1 is still less the reference voltage Vgs, the comparator COM1 continues to output the reset signal RS1, i.e., the voltage V2 on the node N2 is also pulled to the ground voltage GND, such that comparator COM2 continues to output the system reset signal $S_{RESET}$ with low logic level.

At time T3, because the voltage V1 exceeds the reference voltage Vgs, the comparator COM1 pulls the output terminal thereof to the power supply voltage Vdd, i.e., the comparator COM1 stops outputting the reset signal RS1 at this time. Accordingly, one terminal of the resistor R4 is pulled to the power supply voltage Vdd, and the voltage V2 on the node N2 can be regarded as a divided voltage of the power supply voltage Vdd. Because the voltage V2 is still less than the reference voltage Vbg, the comparator COM2 continues pulling the output terminal thereof to the ground voltage GND as the system reset signal $S_{RESET}$.

At time T4, the comparator COM2 pulls high the output terminal thereof to the power supply voltage Vdd, i.e., the comparator COM2 stops outputting the system reset signal $S_{RESET}$ at this time, because the voltage V2 exceeds the reference voltage Vbg.

Figure 7:
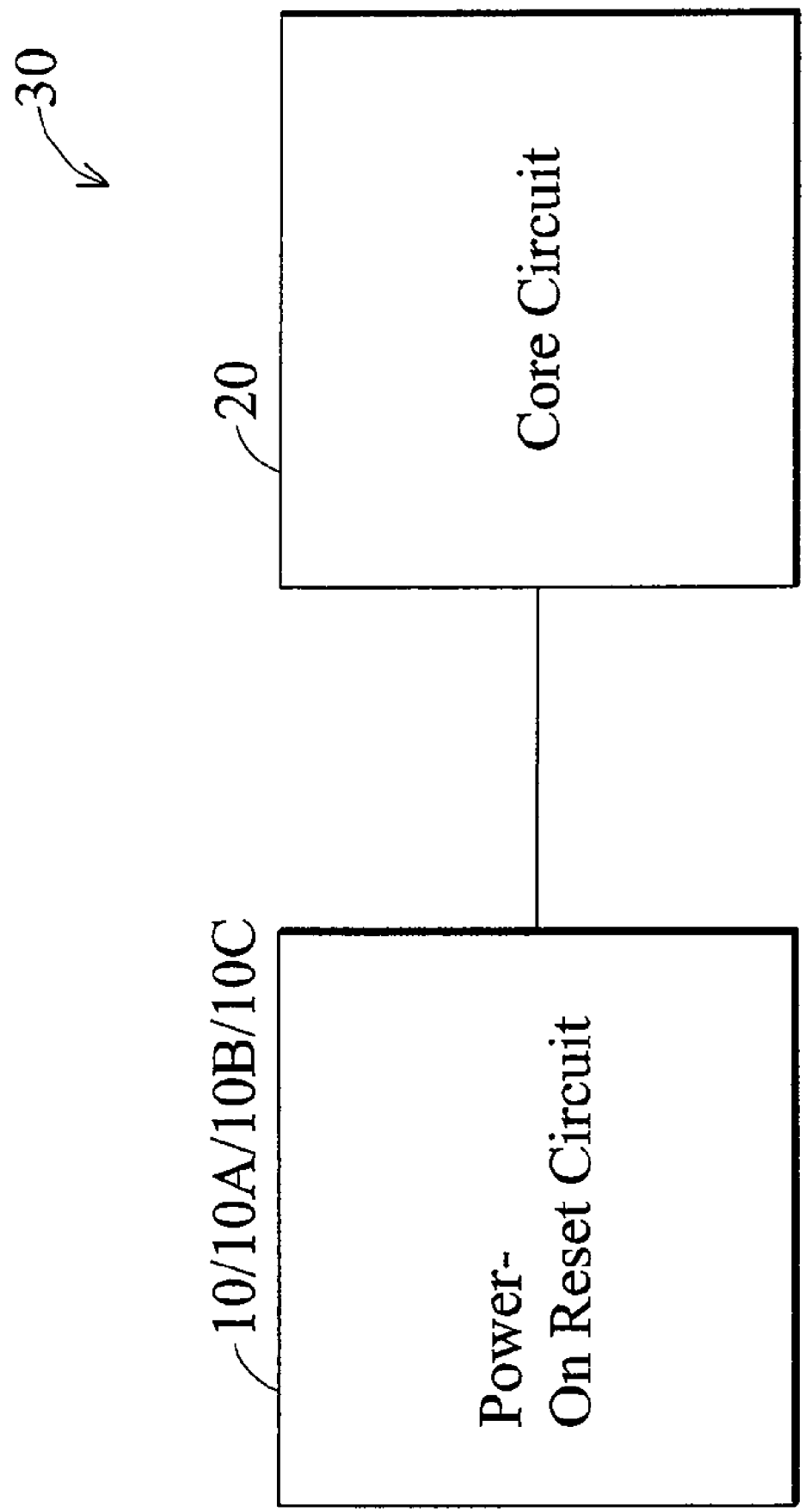
FIG. 7 shows an embodiment of an electronic device.

FIG. 7 shows an embodiment of an electronic device. As shown, the electronic device 30 comprises the power-on reset circuit 10/10A/10B/10C and a core circuit 20. For example, the bandgap reference circuit power-on reset circuits 10 and 10A~10C provides the system reset signal $S_{RESET}$ to reset the core circuit 20 during power-on, thereby preventing the core circuit 20 from operating with low power supply voltage.

The power-on reset circuits 10 and 10A~10C of the invention can act as a necessary functional block for mixed-mode and analog integrated circuits (ICs), such as data converters, phase lock-loop (PLL), oscillators, power management circuits, dynamic random access memory (DRAM), flash memory, a microprocessing unit (MPU), a digital signal processor, a microcontroller, a central processing unit, or a microprocessor or electronics devices, such as a digital camera, a portable DVD, a television, a car display, a PDA, notebook computer, tablet computer, cellular phone, or a display device, and others.

The invention also provides a power-on reset method to prevent a core circuit from operating with low power supply voltage.

In the power-on reset method, the reset circuit 2 outputs a reset signal RS1 when a voltage V1 obtained by a voltage-divided power supply voltage Vdd is less than a reference voltage Vgs, and the reset circuit 4 outputs a system reset signal $S_{RESET}$ to reset an external circuit (not shown) when the voltage V2 is less than a reference voltage Vbg. For example, the reference voltage Vgs is a threshold voltage of a MOS transistor M1 and is less than the reference voltage Vbg.

The reset circuit 2 stops outputting the reset signal RS1 when the voltage V1 exceeds the reference Vgs, and the reset circuit 4 then outputs the system reset signal $S_{RESET}$ according to a voltage V2 obtained by voltage-divided power supply voltage Vdd and the reference voltage Vbg. For example, the comparator COM2 continues to output the system reset signal $S_{RESET}$ if the voltage V2 is less than the reference voltage Vbg, and stops outputting the system signal $S_{RESET}$ when the voltage V2 exceeds the reference voltage Vbg. Thus, the power-on reset circuit 10 can output the system reset signal to reset the external circuit when the divided voltage of the power supply voltage Vdd is less than the reference voltage Vbg, thereby preventing the core circuit from operating with a lower power supply voltage.

For example, as shown in FIG. 2, when the voltage V1 is less than the reference voltage Vgs, the comparator COM1 pulls the output terminal thereof to the ground voltage GND, i.e., the reset signal RS1 is output to the comparator COM2. When the reset signal RS1 is applied to the first power terminal of the comparator COM2, the comparator COM2 pulls the output terminal thereof to the ground voltage GND regardless of the voltage V2. Namely, the system reset signal $S_{RESET}$ (with low logic level) is output to the external circuit (not shown). When the voltage V1 exceeds the reference voltage Vgs, the comparator COM1 pulls the output terminal thereof to the power supply voltage Vdd, i.e., the comparator COM1 stops outputting the reset signal RS1 at this time. Because the first power terminal of the comparator COM2 is pulled to the power supply voltage Vdd, the comparator COM2 outputs the system reset signal $S_{RESET}$ according to the voltage V2 and the reference voltage Vbg. The comparator COM2 continues to pull the output terminal thereof to the ground voltage GND as the system reset signal $S_{RESET}$ if the voltage V2 is less than the reference voltage Vbg, and the comparator COM2 pulls high the output terminal thereof to the power supply voltage Vdd if the voltage V2 is not less than the reference voltage Vbg, i.e., the comparator COM2 stops outputting the system reset signal $S_{RESET}$.

Alternatively, as shown in FIG. 4, the reset signal RS1 is applied to the control terminal of the multiplexer AUX1 coupled between the node N2 and the positive input terminal of the comparator COM2. The multiplexer AUX1 pulls one terminal of the comparator COM2 to the ground voltage GND when receiving the reset signal RS1, such that the comparator COM2 pulls the output terminal thereof to the ground voltage GND regardless of the voltage V2. Namely, the system reset signal $S_{RESET}$ (with low logic level) is output to the external circuit (not shown). When the voltage V1 exceeds the reference voltage Vgs, the comparator COM1 pulls the output terminal thereof to the power supply voltage Vdd, i.e., the comparator COM1 stops outputting the reset signal RS1 at this time. Hence, the multiplexer AUX1 couples the voltage V2 on the node N2 to the positive input terminal of the comparator COM 2, and thus, the comparator COM2 outputs the system reset signal $S_{RESET}$ according to the voltage V2 and the reference voltage Vbg. The comparator COM2 continues to pull the output terminal thereof to the ground voltage as the system reset signal $S_{RESET}$ if the voltage V2 is less than the reference voltage Vbg, and the comparator COM2 pulls high the output terminal thereof to the power supply voltage Vdd if the voltage V2 is not less than the reference voltage Vbg, i.e., the comparator COM2 stops outputting the system reset signal $S_{RESET}$.

Figure 6:
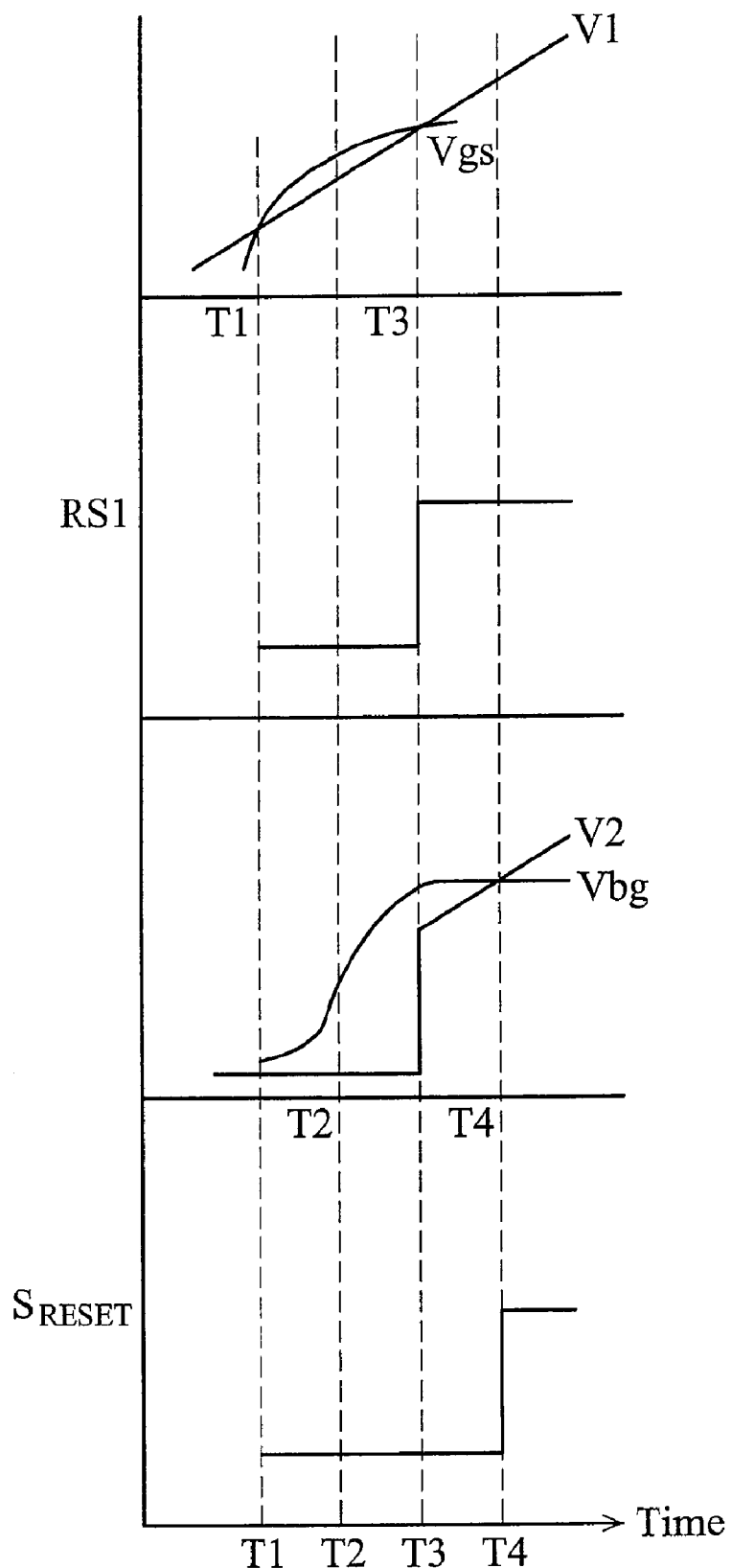
FIG. 6 shows an output wave diagram of the power-on reset circuit shown in FIG. 5.

Additionally, as shown in FIG. 5 and FIG. 6, when the voltage V1 is less than the reference voltage Vgs, the comparator COM1 pulls the output terminal thereof to the ground voltage GND, i.e., the reset signal RS1 is output to the resistor R4 coupled to the positive input terminal of the comparator COM2. Because the resistors R4 and R5 are both coupled to the ground voltage GND, the voltage V2 on the node N2 is pulled to the ground voltage GND accordingly. Hence, the voltage V2 is less than the reference voltage Vbg and thus, the comparator COM2 pulls the output terminal thereof to the ground voltage GND as the system reset signal $S_{RESET}$. When the voltage V1 exceeds the reference voltage Vgs, the comparator COM1 pulls the output terminal thereof to the power supply voltage Vdd, i.e., the comparator COM1 stops outputting the reset signal RS1 at this time. Accordingly, one terminal of the resistor R4 is pulled to the power supply voltage Vdd, and the voltage V2 on the node N2 can be regarded as a divided voltage of the power supply voltage Vdd. Thus, the comparator COM2 outputs the system reset signal $S_{RESET}$ according to the voltage V2 and the reference voltage Vbg. The comparator COM2 continues to pull the output terminal thereof to the ground voltage GND as the system reset signal $S_{RESET}$ if the voltage V2 is less than the reference voltage Vbg, and the comparator COM2 pulls high the output terminal thereof to the power supply voltage Vdd, i.e., the comparator COM2 stops outputting the system reset signal $S_{RESET}$ if the voltage V2 is not less than the reference voltage Vbg.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A power-on reset circuit, comprising:
   a first reset circuit comprising a first comparator outputting a system reset signal; and
   a second reset circuit outputting a first reset signal to control operations of the first comparator, such that the first reset circuit outputs the system reset signal when a first voltage is less than a first reference voltage, wherein the second reset circuit stops outputting the first reset signal when the first voltage exceeds the first reference voltage, meanwhile the first reset circuit continues to output the system reset signal when a second voltage is less than a second reference voltage, and the first reference voltage is less than the second reference voltage.

2. The power-on reset circuit as claimed in claim 1, wherein the first reset signal is coupled to a power terminal of the first comparator, such that the first comparator outputs the system reset signal when receiving the first reset signal.

3. The power-on reset circuit as claimed in claim 1, wherein the first reset circuit further comprises a multiplexer coupled to one input terminal of the first comparator, pulling the input terminal to a ground voltage when receiving the first reset signal, such that the first comparator outputs the system reset signal accordingly.

4. The power-on reset circuit as claimed in claim 1, wherein the first reset signal is coupled to one input terminal of the first comparator by a voltage-divided unit, such that the first comparator outputs the system reset signal when receiving the first reset signal.

5. The power-on reset circuit as claimed in claim 1, wherein the first reset circuit stops outputting the system reset signal when the second voltage exceeds the second reference voltage.

6. The power-on reset circuit as claimed in claim 1, wherein the first voltage and the second voltage are obtained by performing voltage division on a power supply voltage.

7. The power-on reset circuit as claimed in claim 1, wherein the second reset circuit further comprises a voltage supply unit to provide a threshold voltage of a transistor to serve as the first reference voltage.

8. The power-on reset circuit as claimed in claim 1, wherein the first reset circuit further comprises a bandgap reference circuit to provide the second reference voltage.

9. A power-on reset circuit, comprising:
   a first reset circuit outputting a first reset signal when a voltage-division of a power supply voltage is less than a reference voltage; and
   a second reset circuit coupled to the first reset circuit in series, comprising a first comparator with a power terminal receiving the first reset signal and controlled by the first reset signal to output a system reset signal to reset an external circuit.

10. A power-on reset circuit, comprising:
    a first reset circuit comprising a first comparator with a first input terminal coupled to a first reference voltage, a second input terminal coupled to a first node and an output terminal generating a first reset signal; and
    a second reset circuit comprising a second comparator with a first input terminal coupled to a second reference voltage and a second input terminal coupled to a second node and an output terminal generating a system reset signal, wherein the output terminal of the first comparator is coupled to the second comparator, and the first reference voltage is less than the second reference voltage.

11. The power-on reset circuit as claimed in claim 10, wherein the second comparator further comprises a power terminal coupled to the output terminal of the first comparator.

12. The power-on reset circuit as claimed in claim 10, wherein the second reset circuit further comprises a multiplexer with a first input terminal coupled to the second node, a second input terminal coupled to a ground voltage, a control terminal coupled to the output terminal of the first comparator and an output terminal coupled to the second input terminal of the second comparator.

13. The power-on reset circuit as claimed in claim 10, wherein the second reset circuit further comprises a first resistor coupled between the supply voltage and the second node, and a second resistor coupled between the second node and the ground voltage.

14. The power-on reset circuit as claimed in claim 10, wherein the second reset circuit further comprises a first resistor coupled between the output terminal of the first comparator and the second node and a second resistor coupled between the second node and the ground voltage.

15. The power-on reset circuit as claimed in claim 10, wherein the first reset circuit further comprises:
- a third resistor coupled between a power supply voltage and the first node;
- a fourth resistor coupled between the first node and the ground voltage; and
- a voltage supply unit providing the first reference voltage.

16. The power-on reset circuit as claimed in claim 15, wherein the voltage supply unit provides a threshold voltage of a transistor to serves as the first reference voltage.

17. The power-on reset circuit as claimed in claim 10, wherein the second reset circuit further comprises a bandgap reference circuit providing the second reference voltage.

18. A power-on reset circuit, comprising:
- a first reset circuit comprising:
  - a first voltage supply unit providing a first reference voltage; and
  - a first comparator comprising a first input terminal coupled to the first reference voltage, a second input terminal coupled to a first node in a first resistor string coupled between a power supply voltage and a ground voltage and an output terminal generating a first reset signal; and
- a second reset circuit comprising:
  - a second voltage supply unit providing a second reference voltage; and
  - a second comparator comprising a first input terminal coupled to the second reference voltage and a second input terminal coupled to a second node in a second resistor string and an output terminal generating a system reset signal, wherein the output terminal of the first comparator is coupled to the second resistor string, a power terminal of the second comparator or the second input terminal thereof, and the first reference voltage is less than the second reference voltage.

19. The power-on reset circuit as claimed in claim 18, wherein the first voltage supply unit provides a threshold voltage of a transistor to serve as the first reference voltage, and the second voltage supply unit comprises a bandgap reference circuit.

20. The power-on reset circuit as claimed in claim 19, wherein the second reset circuit further comprises a multiplexer comprising a first input terminal coupled to the second node, a second input terminal coupled to the ground voltage, a control terminal coupled to the output terminal of the first comparator and an output terminal coupled to the second input terminal of the second comparator.

21. The power-on reset circuit as claimed in claim 19, wherein the second resistor string comprises a first resistor coupled between the output terminal of the first comparator and the second node and a second resistor coupled between the second node and the ground voltage.

* * * * *